United States Patent
Horan et al.

(10) Patent No.: US 6,168,460 B1
(45) Date of Patent: Jan. 2, 2001

(54) A-BASE TERMINAL BLOCK ASSEMBLY

(75) Inventors: Patrick Joseph Horan, Dover; Wayne Alfrede Therrien, Rochester, both of NH (US)

(73) Assignee: General Electric Company, Schenectady, NY (US)

(*) Notice: Under 35 U.S.C. 154(b), the term of this patent shall be extended for 0 days.

(21) Appl. No.: 09/056,505

(22) Filed: Apr. 7, 1998

(51) Int. Cl.$^7$ .................................................. H01R 33/945
(52) U.S. Cl. ............................................................ 439/517
(58) Field of Search ................................. 439/517, 71 B, 439/721, 724; 361/669

(56) References Cited

U.S. PATENT DOCUMENTS

| | | | |
|---|---|---|---|
| 2,610,996 | * 9/1952 | Rickabaugh | 439/517 |
| 3,172,720 | * 3/1965 | Teuscher et al. | 439/517 |
| 3,638,119 | * 1/1972 | Makenzie | 439/517 |
| 5,577,933 | * 11/1996 | Robinson et al. | 439/517 |
| 5,834,932 | * 11/1998 | May | 439/517 |

* cited by examiner

*Primary Examiner*—Khiem Nguyen
*Assistant Examiner*—J. F. Duverone
(74) *Attorney, Agent, or Firm*—Carl B. Horton, Esq.; Damian Wasserbauer, Esq.; Armstrong Teasdale LLP (57) ABSTRACT

A terminal block configured to be used with self contained and transformer rated electricity meters includes at least one first cavity having at least one rib. The terminal block also includes a top having a plurality of current terminal extension members and a plurality of potential terminal extension members. A back of the terminal block includes at least one slot in communication with at least one second cavity. The second cavity is also in communication with at least one opening. The self contained meters utilize a terminal block assembly that includes the terminal block, a plurality of current terminals, a plurality of test link springs, and a plurality of actuator screws. The test link spring is positioned, at least partially, within the test link spring cavity and is configured to connect a potential wire to one of the current terminals. The actuator screw is configured to screw into a respective current terminal threaded opening and thereby move the test link spring from an open position to a closed position.

33 Claims, 14 Drawing Sheets

A-BASE TERMINAL BLOCK ASSEMBLY

FIELD OF THE INVENTION

This invention relates generally to electricity metering devices and, more particularly, to a terminal block that can be used with both self contained and transformer rated electricity meters.

BACKGROUND OF THE INVENTION

In the past, separate A-base terminal blocks for electricity meters were manufactured for self contained meters and for transformer rated meters. The two separate terminal blocks require that sufficient inventories of both blocks be maintained. In addition, separate tooling is required for each block.

A test link has been used with the self contained A-base type meters to connect a potential wire to a current terminal. The test link requires the use of two spacers, two screws, one test link terminal, and one test link. Use of the test link results in high fabrication and assembly costs due to the number of parts required for proper operation.

Accordingly, it would be desirable to provide a terminal block capable of being used in both self contained and transformer rated meters, which would facilitate reducing inventory and fabrication costs. It also would be beneficial to provide a simple test link, for use in self contained meters, which reduces the number of parts and assembly time as compared to the known test link.

SUMMARY OF THE INVENTION

These and other objects may be attained by an electricity meter having an A-base terminal block assembly including an A-base terminal block, a plurality of current terminals, and in a self contained meter, a plurality of test link springs. The electricity meter can be, for example, an EV or a kV meter made by General Electric Company, Somersworth, New Hampshire. The terminal block can be used in both self contained and transformer rated electricity meters. The terminal block, in one embodiment, is fabricated from a thermoplastic injection molding compound, such as polyester, or a thermoset molding compound, such as phenolic, and has a top, a bottom, a front, a back, a right side, and a left side. A plurality of current terminal cavities are located in the back of the terminal block and include at least one rib. A plurality of current terminal extension members and a plurality of potential terminal extension members are located on the top of the terminal block. Each current terminal extension member and each potential terminal extension member have an opening therethrough, an inner surface, and an outer surface. In addition, each current terminal extension member opening is in communication with a corresponding current terminal cavity.

The top of the terminal block also includes a plurality of actuator screw openings. Each actuator screw opening is in communication with a corresponding test link spring cavity. Each current terminal cavity houses a current terminal, and each test link spring cavity houses, at least partially, a respective test link spring. Each of a plurality of test link spring insertion slots are in communication with a respective test link spring cavity.

The test link springs have a first portion, a second portion extending from the first portion at an angle approximately about 90 degrees, a third portion extending from the second portion at an acute angle, and a fourth portion extending from the third portion at an obtuse angle when the test link spring is in an unstressed state. Each test link spring connects a potential wire to one of the current terminals.

The first portion of the test link spring has a flat portion with a first opening for a test fixture screw and a tab connected to the flat portion by a tab neck. The tab can be soldered to a potential terminal wire. The first portion also contains a bend relief area and a second opening configured for insertion of at least a portion of the potential terminal wire. The second opening is located on the tab.

The fourth portion of the test link spring has a slot for insertion of an actuator screw used to manipulate the fourth portion between an open position and a closed position. In the closed position, the third portion extends from the second portion at an angle approximately about 90 degrees.

The actuator screw has a shoulder for cooperating with the screw insertion slot. At least one of the current terminals contain a threaded opening for mating with the actuator screw. Upon turning the actuator screw, the fourth portion of the test link spring can move from an open position in which the fourth portion is distanced from the current terminal to a closed position in which the fourth portion abuts the current terminal.

The terminal block also contains a plurality of potential lead connection wire openings separated from adjacent potential lead connection wire openings by at least one barrier wall. The barrier walls insulate each terminal from other terminals. Generally, not all openings in the terminal block are used for all configurations. In the past, programming, or drilling of holes, was required as orders came into the factory for terminal blocks. Additional paperwork and manpower were required to support these changes. Additionally, subassemblies had to be built ahead of time and had to be ready for installment at final assembly when required.

To solve this problem, one basic terminal block is molded at the factory with all of the openings initially open. Inserts are then placed in any unused current and potential terminal locations of the new terminal block. The use of inserts eliminates the requirement for drilling and allows assemblers to add inserts to fill the unused openings as required. In the new terminal block, the insert for the current lead position will have a knockout installed to allow for passage of option cables through the front of the meter. The inserts can be applied at a later point in the meter assembly. This will eliminate a costly and time consuming rework operation where the front opening of an unused current terminal location is epoxied closed and drilled open for a smaller cable opening.

A major benefit of the new terminal block assembly over previous terminal blocks is the consolidation of two terminal blocks into one terminal block. Generally, two different terminal blocks are used to build meters, one for self contained meters, and one for transformer rated meters. Due to the configuration of the new terminal block, the terminal block can be used with both self contained and transformer rated electricity meters. In the self contained meters, a new test link connector is used with the new terminal block to form a terminal block assembly.

The above described terminal block will meet the needs of electro-mechanical polyphase, electronic EV meters and the new kV meter with an all plastic housing. The form, fit, and function have been preserved and the new terminal block will fit many different types of A-base meters.

DETAILED DESCRIPTION

Figure 1:
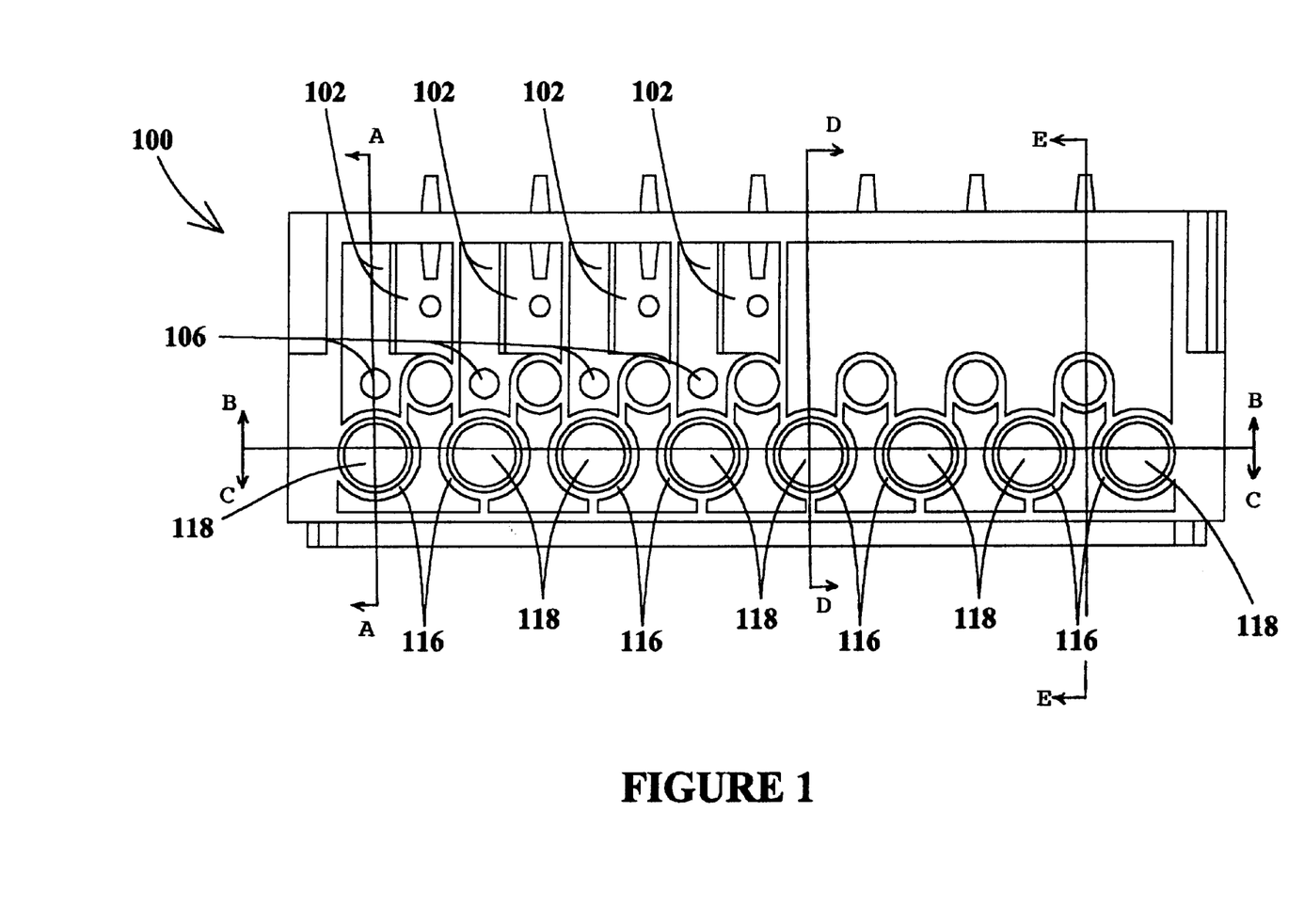
FIG. 1 is a top view of a terminal block in accordance with one embodiment.

FIG. 1 is a top view of a terminal block 100 fabricated from a thermoplastic injection molding compound. One embodiment of terminal block 100 uses a thermoplastic injection molding compound of polyester material with mineral and glass filler and reinforcement. One such readily available material is a VALOX™ compound, which is available from General Electric Company, Pittsfield, Mass. Polyester has many benefits as a material for terminal block 100 due to its electrical properties, outside weatherability, high temperature stability, good dimensional stability, low moisture absorption, ultra violet stability, good reproducibility, its toughness, its arc trac resistance, and its low costs in association with its performance characteristics.

Terminal block 100 can be used in an electricity meter (not shown), for example, an EV or a kV meter made by General Electric Company, Somersworth, New Hampshire. Terminal block 100 has a plurality of test link spring cavities 102, each containing a tab positioning slot 104. One embodiment of terminal block 100 has four test link spring cavities 102. Terminal block 100 also has a plurality of test link spring actuator screw openings 106. Each actuator screw opening 106 is in communication with a corresponding one of test link spring cavities 102.

Figure 2:
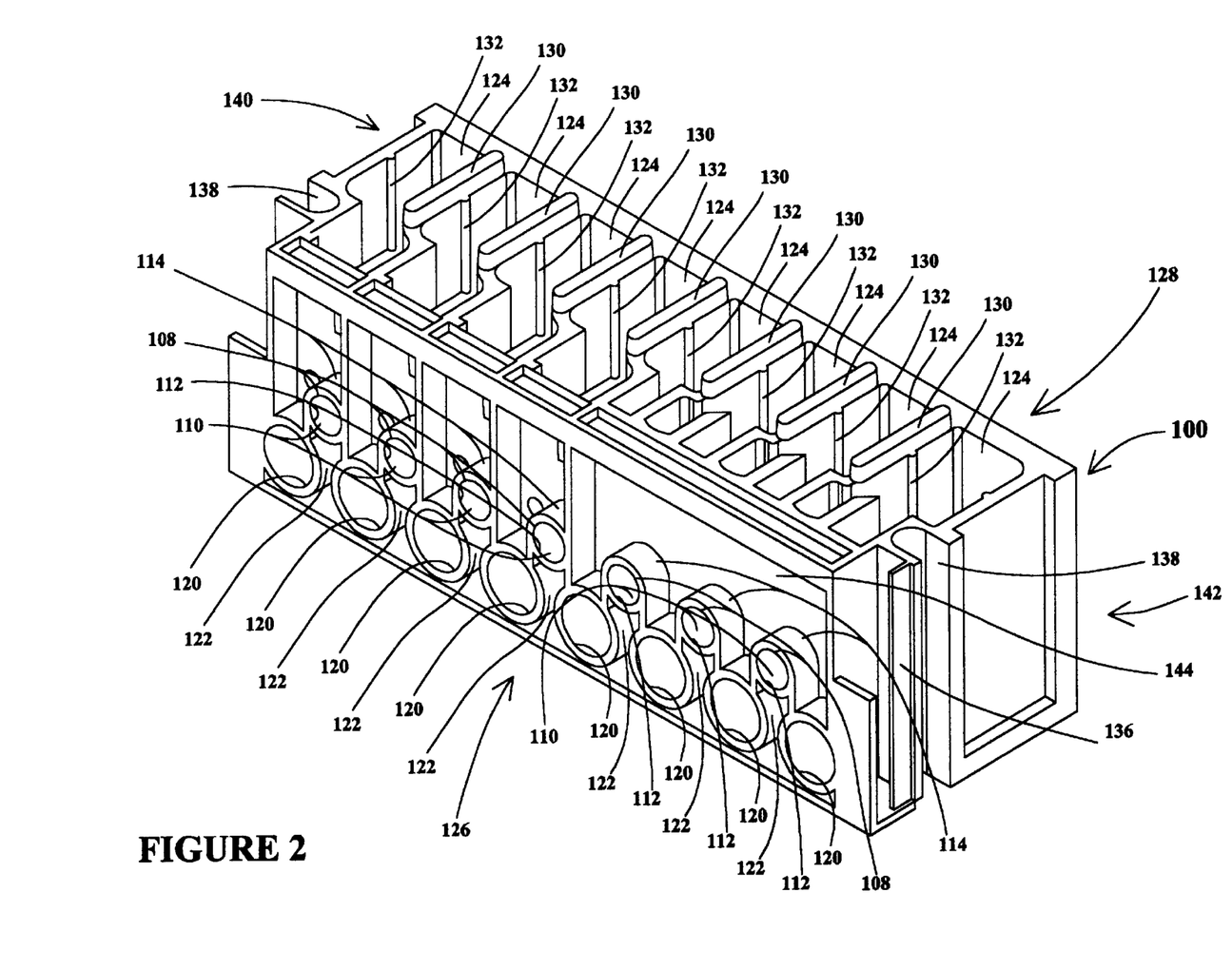
FIG. 2 is a perspective of the terminal block shown in FIG. 1.

Terminal block 100, as seen in FIGS. 1 and 2, contains a plurality of potential terminal extension members 108 that have an opening 110 therethrough, an inner surface 112, and an outer surface 114. The potential terminal extension members 108 are located above and between a plurality of current terminal extension members 116. The current terminal extension members 116 have an opening 118 therethrough, an inner surface 120, and an outer surface 122. Each current terminal extension member opening 116 is in communication with a corresponding current terminal cavity 124. Potential terminal extension members 108 and current terminal extension members 116 are located on a top side 126 of terminal block 100. One embodiment of terminal block 100 has eight current terminal openings 118. The spacing and size are generally defined by ANSI standards.

FIG. 2 is a perspective view of terminal block 100 having a plurality of current terminal cavities 124 located in a back side 128 of terminal block 100 and separated by a plurality of barrier walls 130. Each barrier wall 130 contains a plurality of ribs 132. Preferably, each current terminal cavity 124 has two ribs 132. One rib 132 is located on either side of each current terminal cavity 124. Ribs 132 are used for positioning current terminals 134 within the current terminal cavities 124. Previous terminal blocks used thick walls and no ribs 132. Ribs 132 permit the barrier walls 130 to be thin and still provide proper support and retention ability.

A retention wall 136 can connect terminal block 100 to a polyphase meter seal tab (not shown). Retention wall 136 supports and retains the polyphase meter seal tab. Mounting slots 138, shown on a left side 140 and right side 142 of terminal block 100, are used to secure terminal block 100 to a meter base (not shown).

As shown in FIG. 2, throughout terminal block 100 there are many places where material present in previous terminal blocks has been removed. This absence of material is generally referred to as coring 144. Coring 144 is important to terminal block 100 since it permits terminal block 100 to weigh less and use less material. Both the loss of weight and the use of less material help reduce the costs of manufacturing. Also, the wall sections are much thinner than those disclosed in the prior art. This provides for faster molding cycle times which lead to faster overall molding and a reduction in the cost of the molding process.

Figure 3:
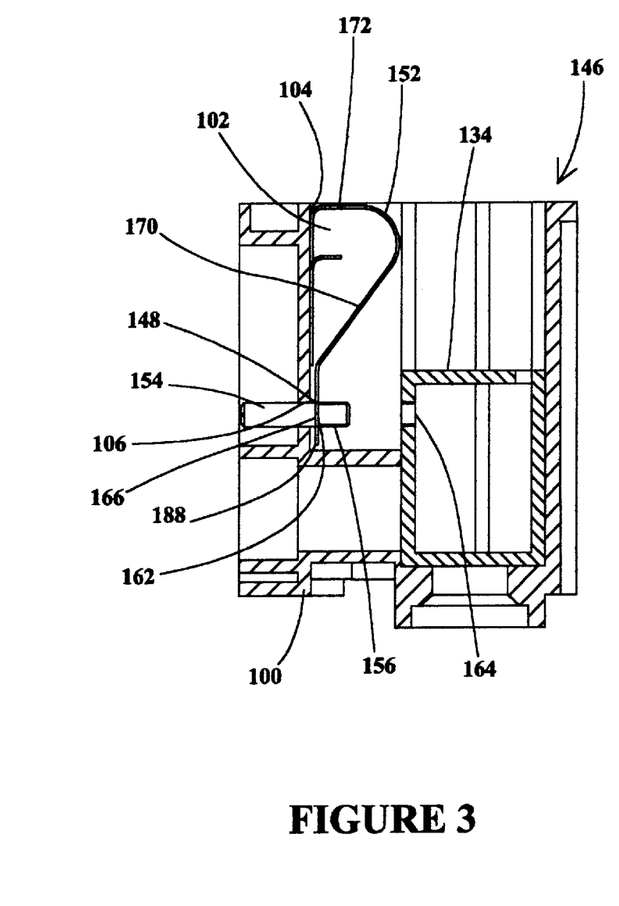
FIG. 3 is a cross-section of the terminal block shown in FIG. 1 along plane A—A including a current terminal and showing a test link connector in the open position.
Figure 4:
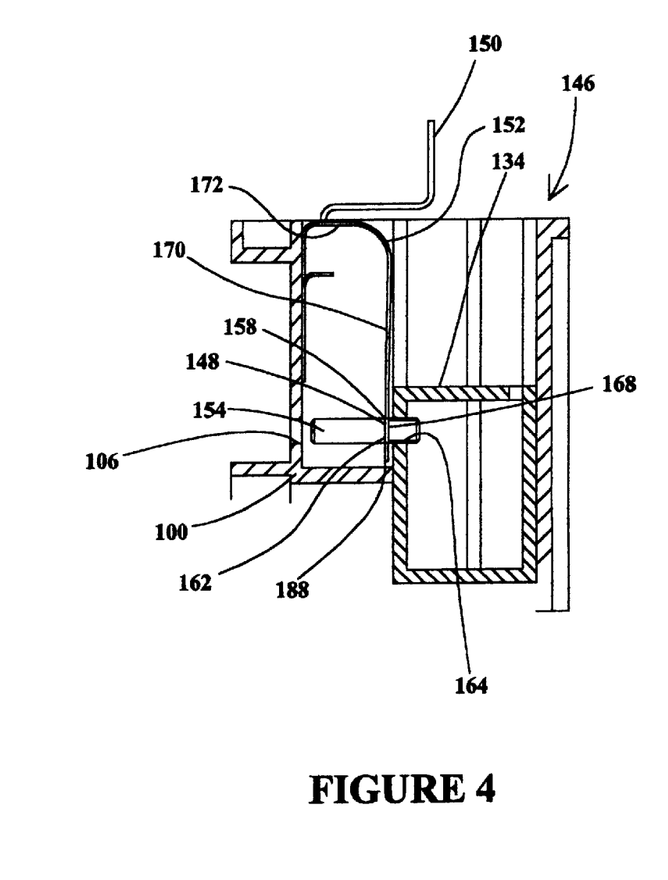
FIG. 4 is a partial cross-section of the terminal block shown in FIG. 1 along plane A—A including the current terminal and the test link connector, shown in FIG. 3, in the closed position.

FIGS. 3 and 4 show a cross section of a terminal block assembly 146 including terminal block 100, a test link connector 148, and current terminal 134. Test link connector 148 can be used with an A-base meter terminal block and connects a potential wire 150 to one of current terminals 134. Potential wire 150 can be connected to an electricity meter (not shown) thus permitting a circuit to be opened and closed between the electricity meter and current terminal 134. Test link connector 148 includes a test link spring 152 and a test link spring actuator screw 154.

Actuator screw 154 has a threaded end 156 and a shoulder 158 for cooperating with a screw insertion slot 160 on a fourth portion 162 of test link spring 152. Shoulder 158 is distanced from both ends of actuator screw 154. At least one current terminal 134 contains a threaded opening 164 for mating with actuator screw 154. In one embodiment, up to four current terminals 134 are in communication with a respective one of four actuator screw openings 106. Each actuator screw opening 106 is in communication with a respective one of test link spring cavities 102. Each of the four current terminals 134 have a threaded opening 164 capable of mating with actuator screw threaded end 156. Actuator screw 154 can screw into current terminal threaded opening 164. In operation, actuator screw 154 enters test link spring cavity 102 through actuator screw opening 106. Shoulder 158 of actuator screw 154 cooperates with screw insertion slot 160 on fourth portion 162 of test link spring 152 to move fourth portion 162 of test link spring 152 from an open position 166 to a closed position 168. Open position 166 allows application of voltage and current independently to the meter (not shown), a requirement for proper calibration. Closed condition 168 is required for installation and operation of the meter at a utility customer's site. In open position 166, actuator screw threaded end 156 is spaced from threaded opening 164 of current terminal 134 and fourth portion 162 of test link spring 152 is distanced from current terminal 134. As threaded end 156 of actuator screw 154 is threaded into threaded opening 164 of current terminal 134, test link spring 152 is moved from open position 166 to closed position 168. In closed position 168, fourth portion 162 of test link spring 152 comes in contact with current terminal 134 and abuts current terminal 134. While in closed position 168, a third portion 170 extends from a second portion 172 at an angle approximately equal to 90 degrees.

Figure 5:
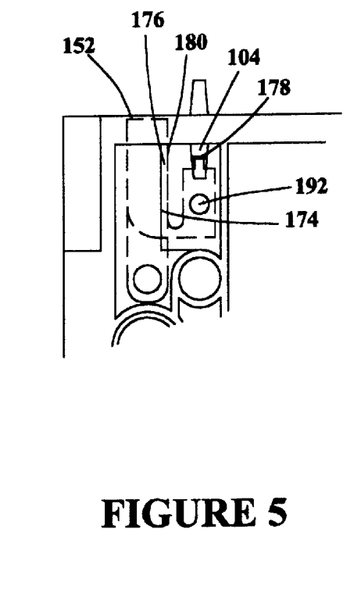
FIG. 5 is a partial top view of the terminal block shown in FIG. 1 showing a test link spring (in phantom) positioned within the terminal block.
Figure 6:
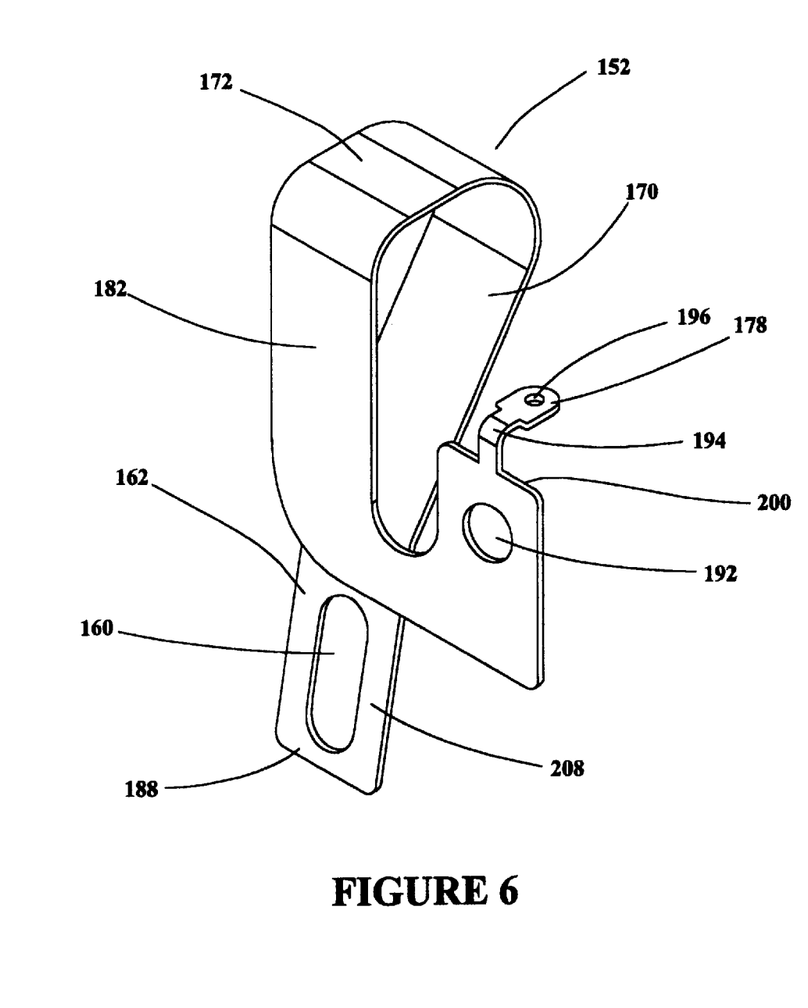
FIG. 6 is a perspective of a test link spring.
Figure 7:
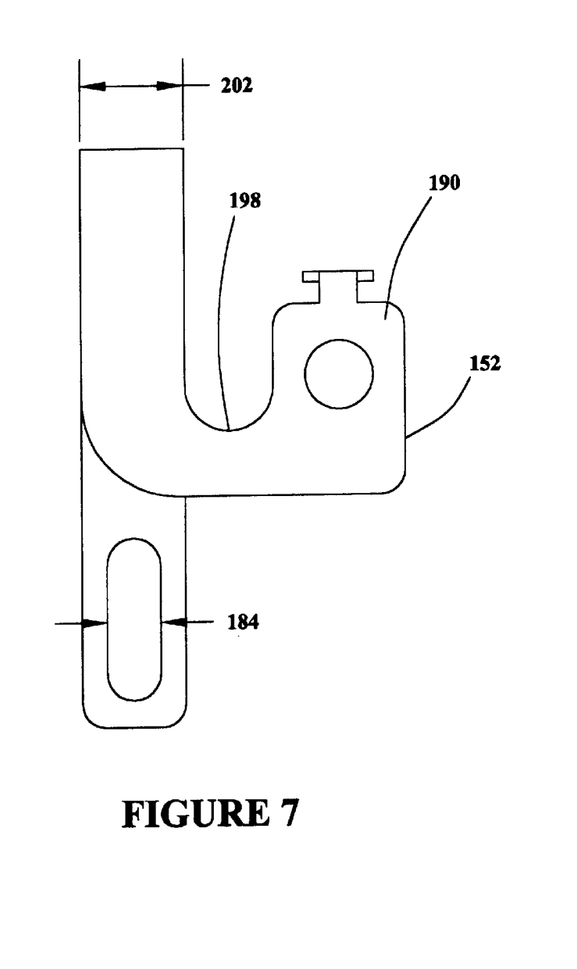
FIG. 7 is a front view of the test link spring shown in FIG. 6.
Figure 8:
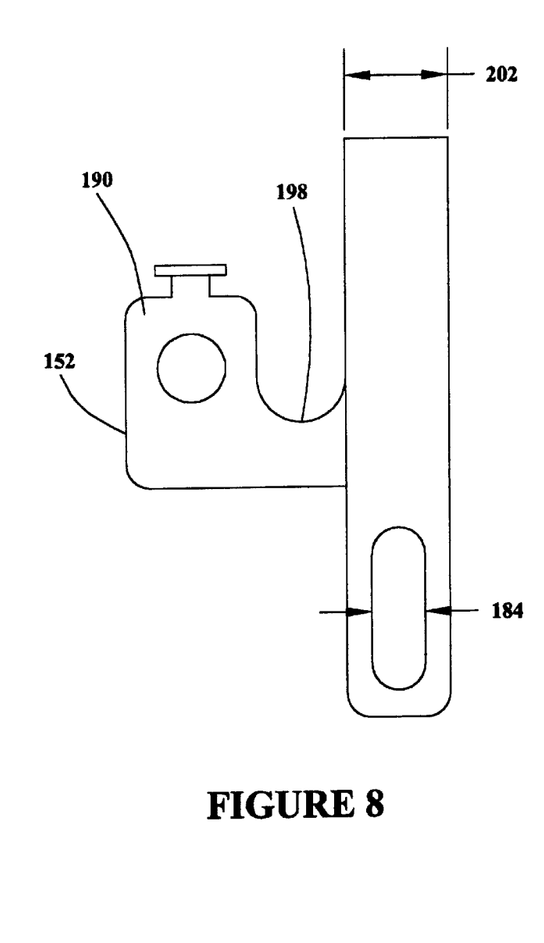
FIG. 8 is a back view of the test link spring shown in FIG. 6.
Figure 9:
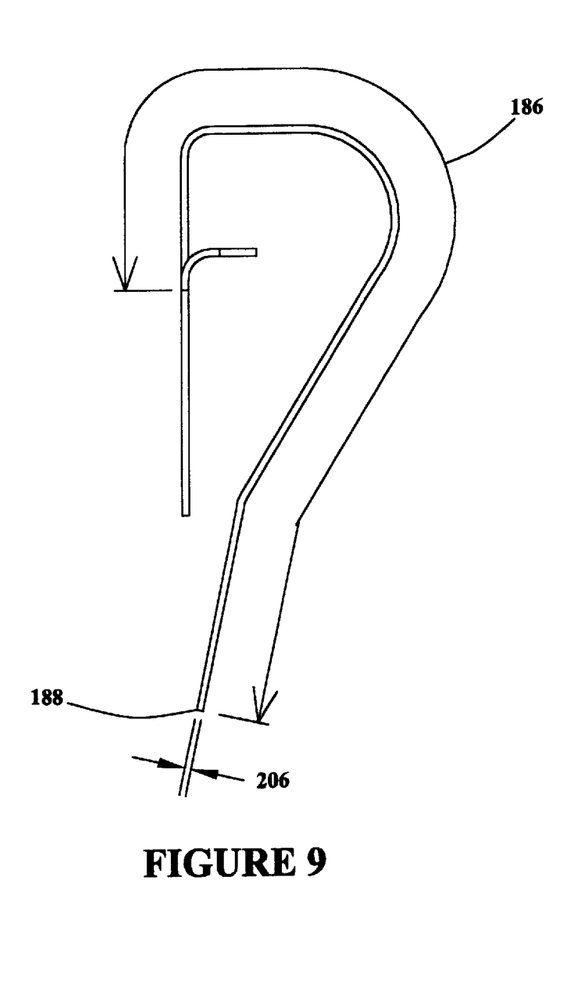
FIG. 9 is a right side view of the test link spring shown in FIG. 6.
Figure 10:
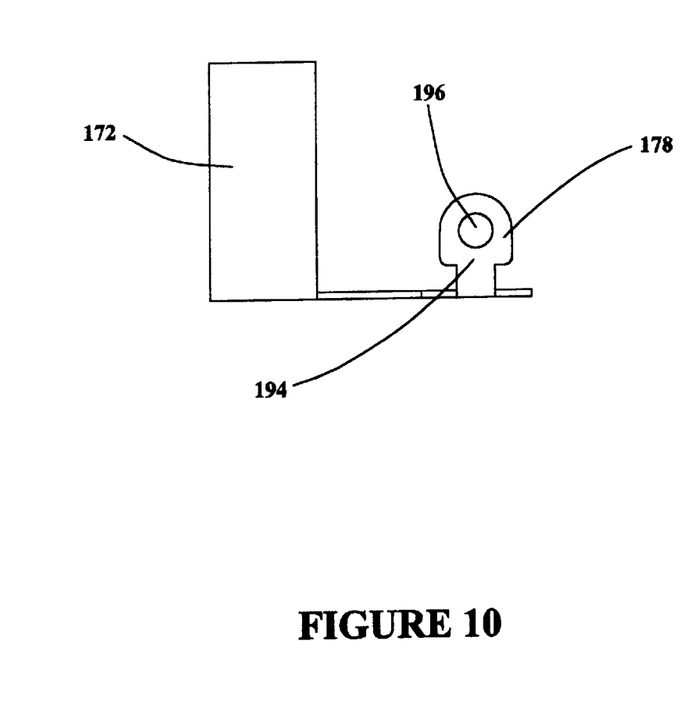
FIG. 10 is a top view of the test link spring shown in FIG. 6.

FIG. 5 is a partial top view and shows tab positioning slot 104 and a side wall 174 of an opening 176. Tab positioning slot 104 is for retaining and/or positioning a solder tab 178 of test link spring 152 in place. Tab 178 of test link spring 152 is wider than slot 104. This interlocking feature holds test link spring 152 in place until test link spring 152 is assembled to the meter. A plane 180 for seating test link spring 152 is also shown.

FIGS. 6–10 illustrate test link spring 152 having a first portion 182, second portion 172, third portion 170, and fourth portion 162. Second portion 172 extends from first portion 182 at an angle approximately about 90 degrees, third portion 170 extends from second portion 172 at an acute angle, and fourth portion 162 extends from third portion 170 at an obtuse angle when test link spring 152 is in an unstressed state. Slot 160 in fourth portion 162 has a width 184.

Test link spring 152 is made of full hard brass that is approximately about 0.012 inch thick and has a sufficient arc length 186 such that an end 188 deflects at least about 0.4 inch without permanent distortion. The use of full hard brass allows test link spring 152 to be formed in a tempered condition without the need for subsequent heat treatment. Additionally, the brass material provides the necessary corrosion protection with the use of plating. For those environments where corrosion protection is absolutely necessary, test link spring 152 can be easily plated with a low cost tin plating. The high hardness of the brass provides the necessary spring qualities required for proper operation of test link spring 152 over its life. Use of test link spring 152 and actuator screw 154 allows for the elimination of two spacers, two screws, one test link terminal, and one test link from the previously known terminal blocks.

First portion 182 of test link spring 152 has a flat portion 190 and a first opening 192 for a test fixture screw (not shown). A tab 178 can be soldered to a potential wire 150. Tab 178 extends from flat portion 190 and is connected to flat portion 190 with a tab neck 194. Tab neck 194 is narrower than tab 178. This relationship provides an undercut that is used to hold test link spring 152 in place in terminal block assembly 146. First portion 182 has a second opening 196 for insertion of at least a portion of potential wire 150. Second opening 196 is located on tab 178. Second opening 196 is used for soldering potential wire 150 that extends from a meter connection (not shown). First portion 182 also has a bend relief area 198. Bend relief area 198 is a cut out area that permits test link spring 152 to bend while reducing the possibility of permanent distortion.

Test link spring 152 is held in place in terminal block 100 by an edge support 200. Test link spring 152 is not clamped tightly into place, but instead is permitted to float on edge support 200. This fixation method reduces the stresses experienced by test link spring 152. Test link spring 152 has a width 202 that allows test link spring 152 to fit into test link spring cavity 102 of terminal block 100. Test fixture screw opening 192 is for clearance of a test fixture screw (not shown) used in some older test equipment.

Figure 11:
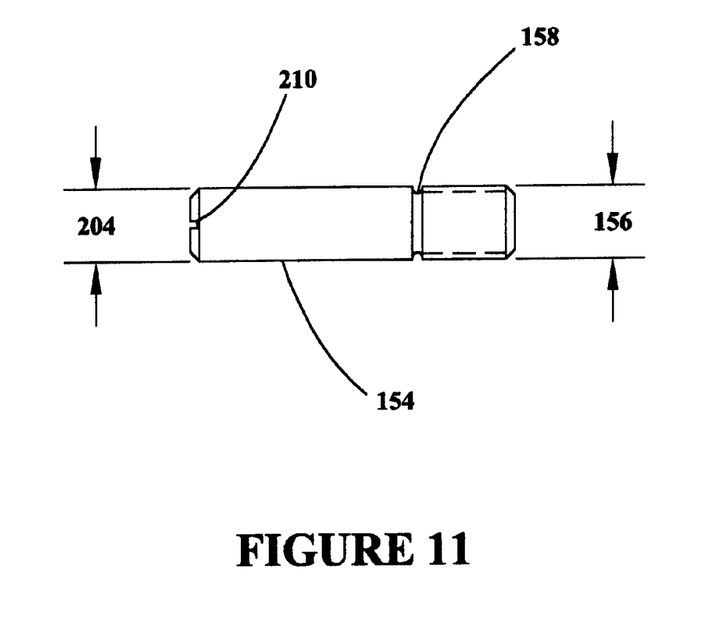
FIG. 11 is a front view of a test link spring actuator screw.
Figure 12:
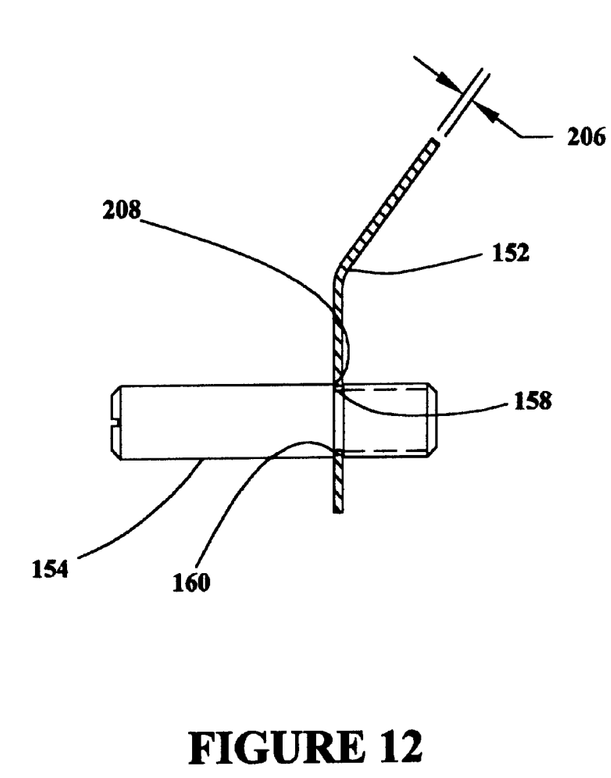
FIG. 12 is a front view of the test link spring actuator screw shown in FIG. 11 shown in mating relation with the test link spring shown in FIG. 6.

FIGS. 11 and 12 show actuator screw 154. Actuator screw 154 has an outer diameter 204 on the upper portion that is slightly larger than the threaded end diameter 156 and slot width 184. Slot 160 and material thickness 206 work co-operatively to capture shoulder 158 of actuator screw 154. This configuration allows actuator screw 154 to be held captive once shoulder 158 mates with surface 208 thus preventing actuator screw 154 from falling through test link spring 152. The cooperation between test link spring 152 and actuator screw 154 also keeps test link spring 152 and actuator screw 154 together whether test link spring 152 and actuator screw 154 are in open 166 or closed 168 position. Screw driver slot 210 aids in the assembly and operation of test link connector 148.

Figure 13:
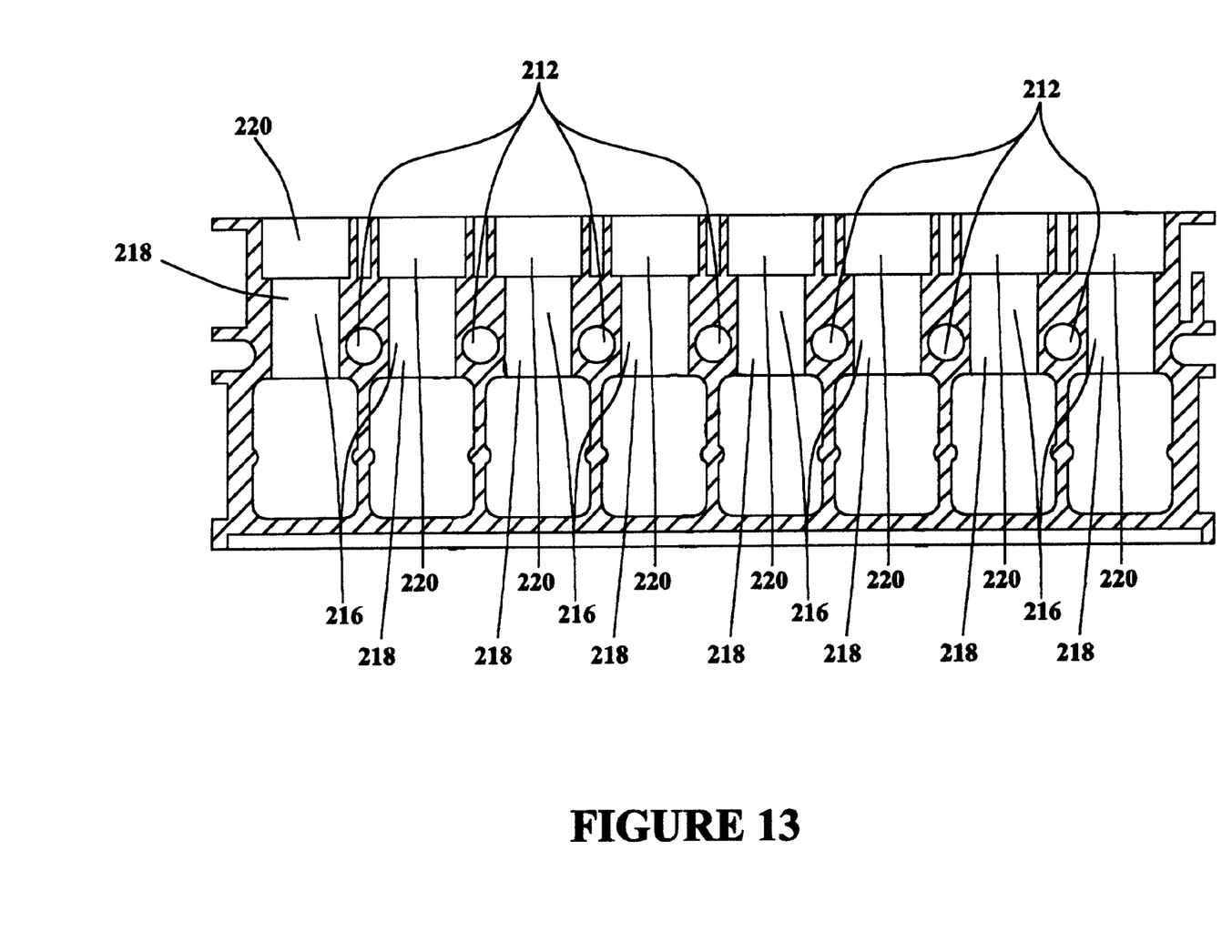
FIG. 13 is a cross-section of the terminal block shown in FIG. 1 as seen from plane B—B.
Figure 14:
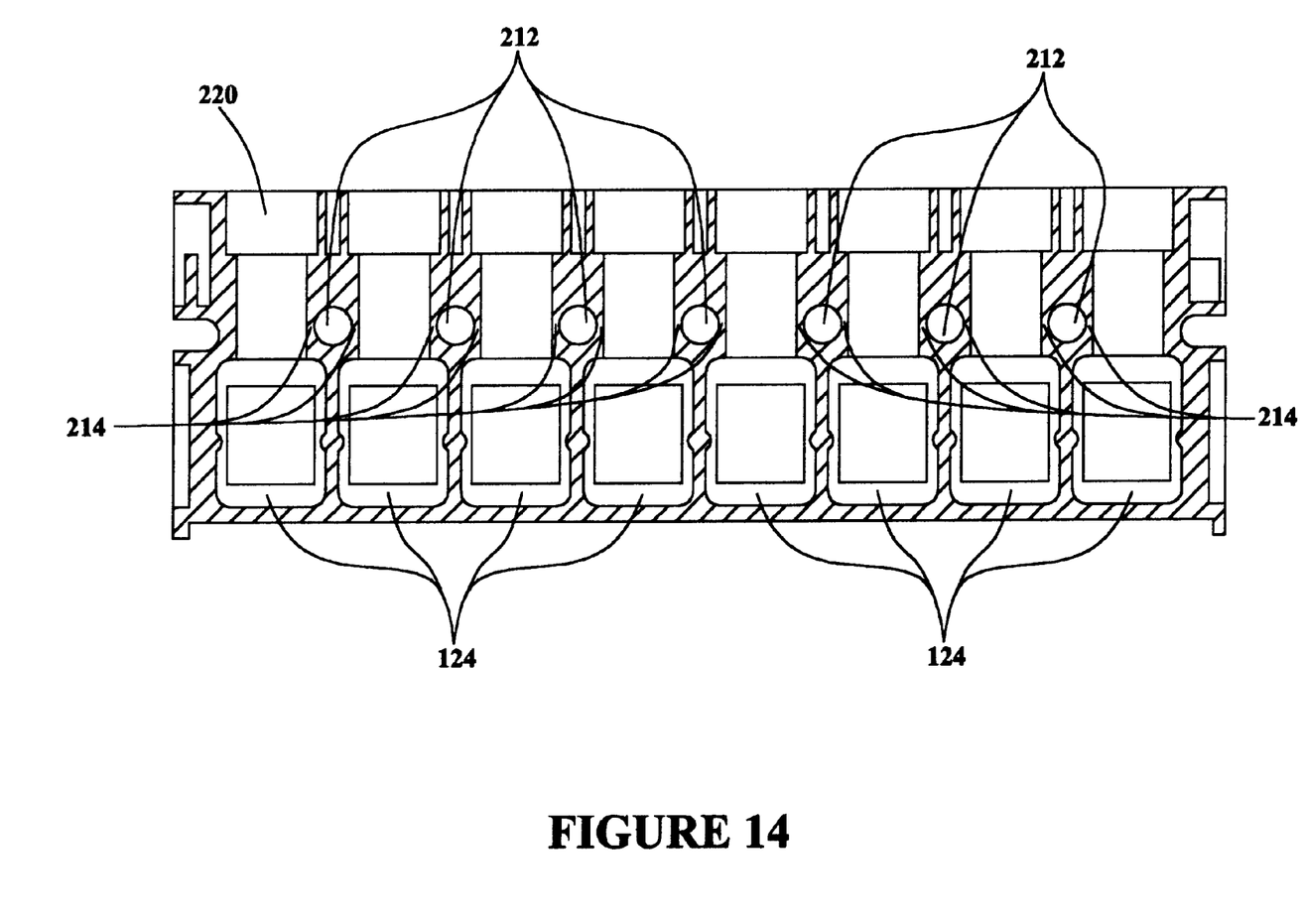
FIG. 14 is a cross-section of the terminal block shown in FIG. 1 as seen from plane C—C.

FIGS. 13 and 14 are cross-sections of terminal block 100 and show a plurality of potential lead connection wire openings 212, a plurality of barrier walls 214, and a plurality of current terminal screw cavities 216. Each potential lead connection wire opening 212 is separated from adjacent potential lead connection wire openings 212 by at least one barrier wall 214. Barrier walls 214 insulate each potential lead connector wire opening 212 from other potential lead connector wire openings 212.

Figure 15:
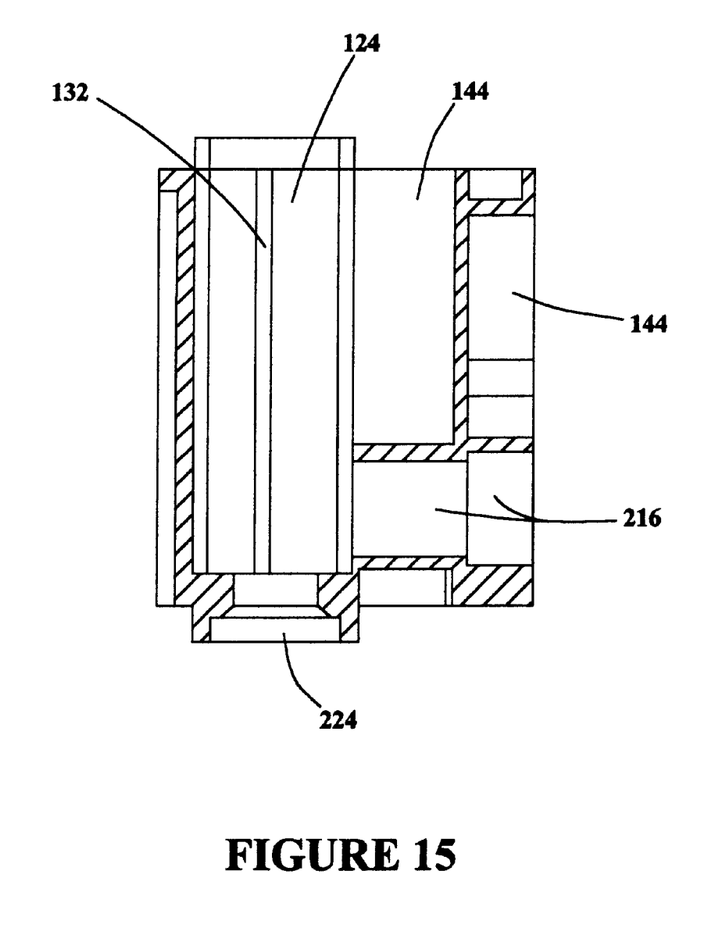
FIG. 15 is a cross-section of the terminal block shown in FIG. 1 along plane D—D.

FIGS. 13–15 show current terminal screw cavity 216 in communication with a respective current terminal cavity 124. In use, a small portion 218 of current terminal screw cavity 216 constrains a screw (not shown) while a large portion 220 of current terminal screw cavity 216 allows for easier assembly and room for insertion of a screw driver tip (not shown).

Figure 16:
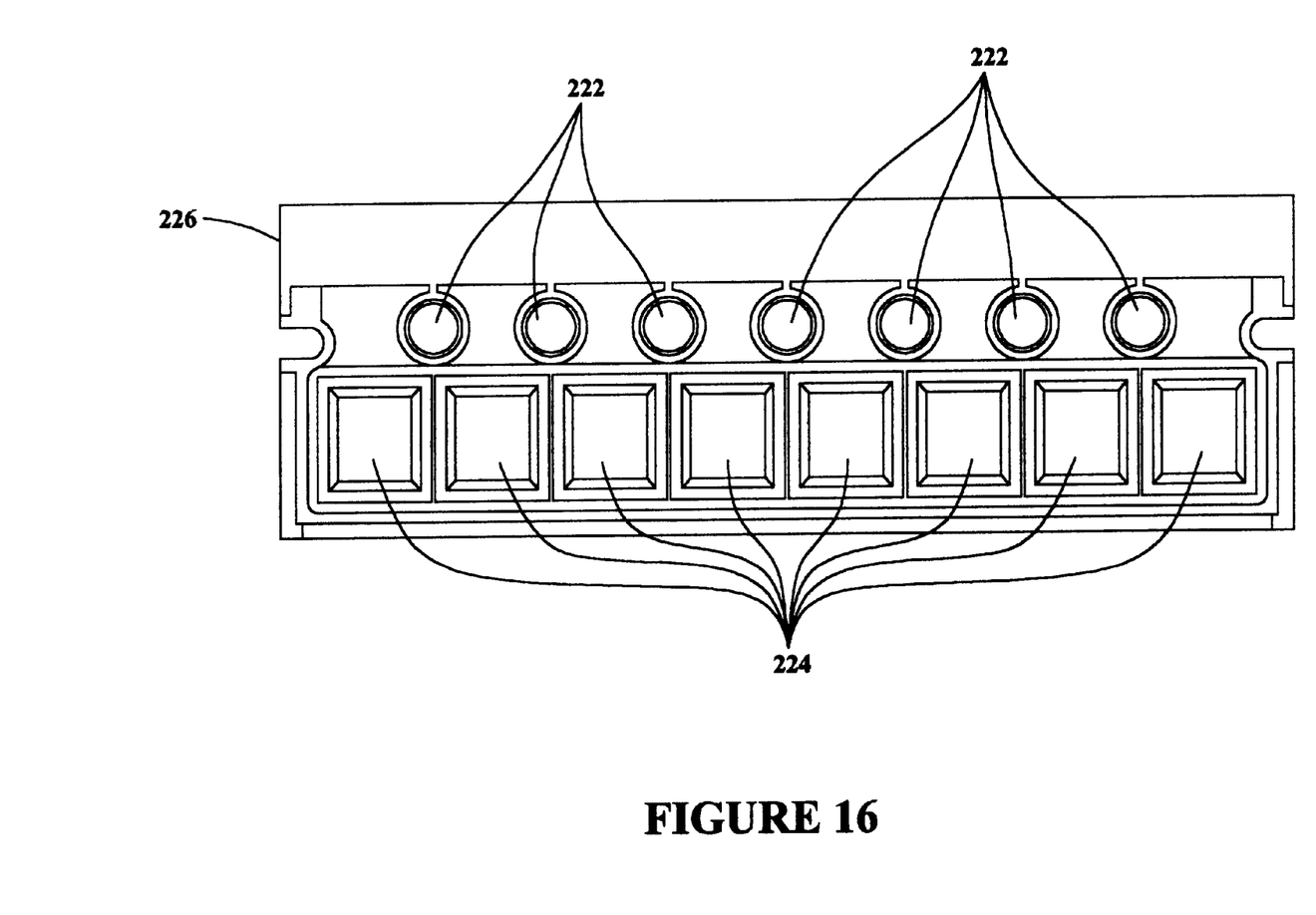
FIG. 16 is a front view of the terminal block shown in FIG. 1.

FIG. 16 is a front view of terminal block 100 and shows a plurality of potential terminal openings 222. A plurality of current terminal openings 224 are also shown on a front side 226 of terminal block 100. Terminal block 100 can be black in color to allow the addition and use of non conductive carbon black by the compounder. Carbon black will improve the ultra violet stability of terminal block 100.

Figure 17:
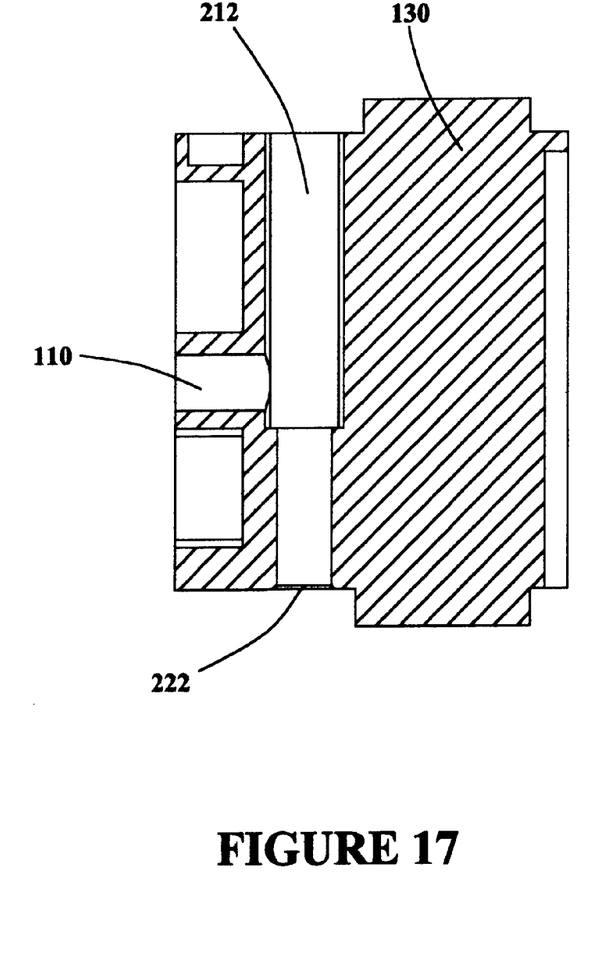
FIG. 17 is a cross-section of the terminal block shown in FIG. 1 along plane E—E.

FIG. 17 is a cross section of terminal block 100 and shows potential terminal screw insertion side opening 110 in communication with potential lead connection opening 212. Barrier wall 130 is also shown.

Figure 18:
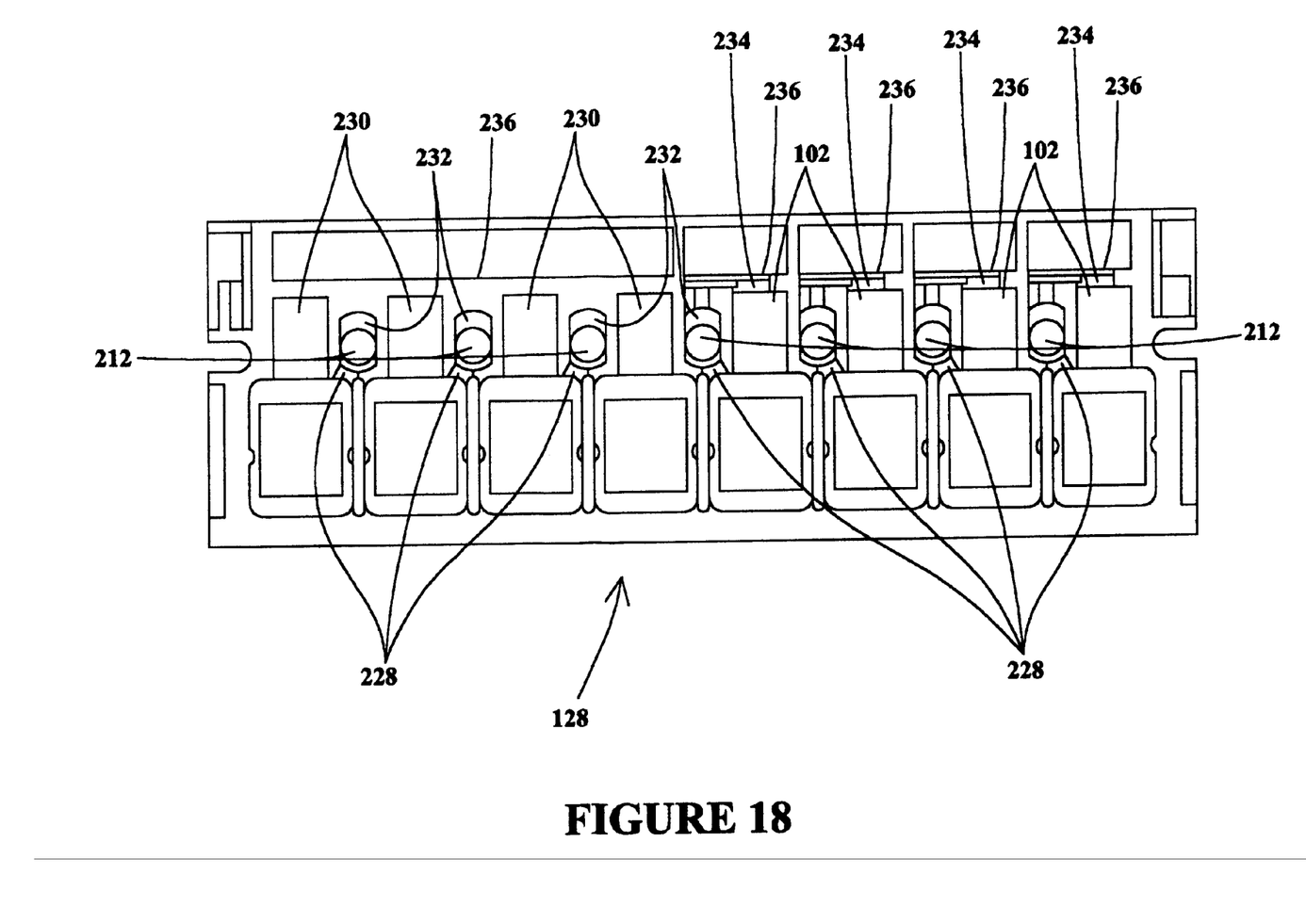
FIG. 18 is a back view of the terminal block shown in FIG. 1.

FIG. 18 is a back view and shows channels 228. Channels 228 are used as pathways for routing of potential wire 150. Channels 228 only allow routing of potential wire 150 at the same relative electrical potential and phase. Channels 228 extend from a respective one of potential lead connection openings 212. Four channels 228 are shown open to the left of terminal block 100 and three channels 228 are shown open to the right of terminal block 100. Cavities 102 permit free movement of test link spring 152 and actuator screw 154. Cavities 230 result in coring 144 since only at the most four test link springs 152 will be used in terminal block assembly 146. Each of a plurality of potential terminal cavities 232 can house at least part of a potential terminal (not shown). The potential terminals (not shown), current terminals 150, mounting hardware (not shown), and method of mounting are similar to those well known in the art. Each test link spring cavity can be inserted, at least partially, into a respective one of test link spring cavities 102 through a respective test link spring insertion slot 234 in back wall 236. Test link spring insertion slot 234 is in communication with test link spring cavity 102.

Figure 19:
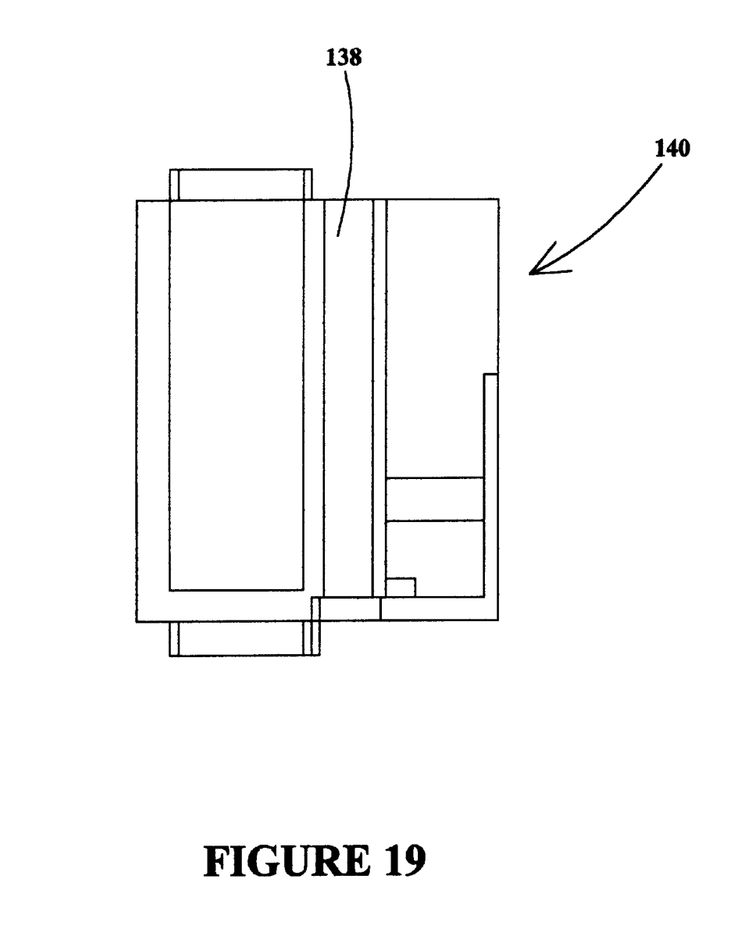
FIG. 19 is a left side view of the terminal block shown in FIG. 1.
Figure 20:
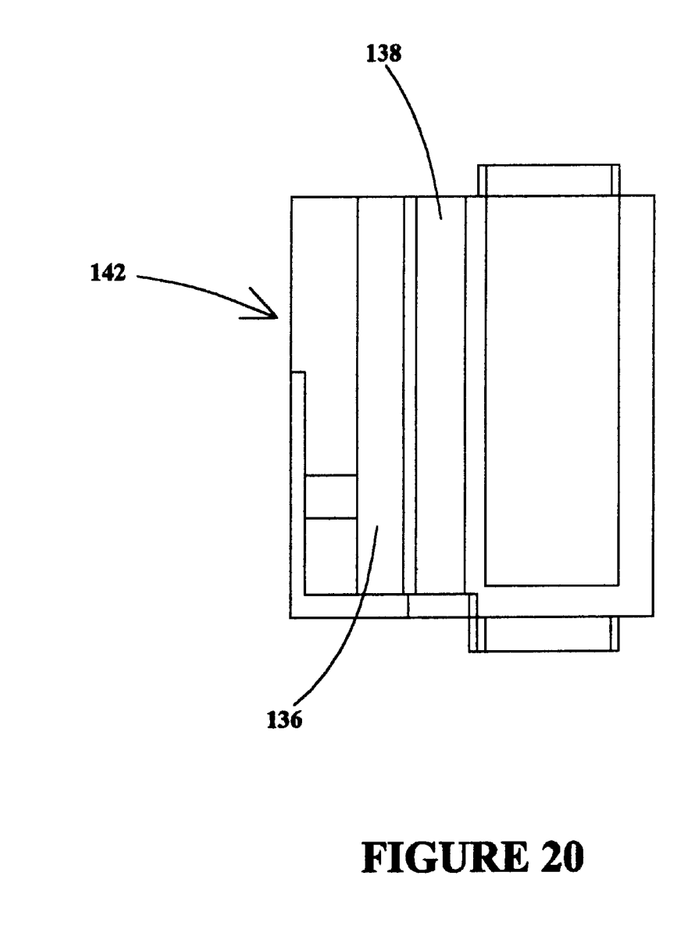
FIG. 20 is a right side view of the terminal block shown in FIG. 1.

FIGS. 19 and 20 show left side 140 and right side 142, respectively, of terminal block 100. Both FIGS. 19 and 20 show mounting slot 138 while FIG. 20 includes retention wall 136. The outside dimensions of terminal block 100 are similar to previous terminal blocks. However, side walls 140 and 142 are drafted to allow for automatic ejection during the molding process.

A major benefit of terminal block 100 over previous terminal blocks is that molded terminal block 100 meets the requirements of both self contained and transformer rated meters. For the self contained meter, test link connectors 148 are used with terminal block 100. This allows one terminal block configuration to be fabricated for both applications. Also, due to the use of inserts, the terminal block can be molded and all of the openings can initially be open. The inserts can be positioned in those openings that will not be used in the intended application. The above described terminal block assembly will meet the needs of electromechanical polyphase, electronic EV meters, and the new kV meter with an all plastic housing.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A terminal block for an electricity meter, said terminal block comprising:
    a top and a back;
    a plurality of sides connecting said top to said back;
    a plurality of current terminal cavities including at least one rib, said current terminal cavities located in said back of said terminal block;
    a plurality of test link spring insertion slots;
    a plurality of test link spring cavities in communication with said spring insertion slots; and
    a plurality of actuator screw openings located on said top of said terminal block, each said actuator screw opening in communication with a respective one of said spring cavities.

2. A terminal block in accordance with claim 1 further comprising a plurality of current terminal extension members located on said top of said terminal block, said plurality of current terminal extension members comprising an opening therethrough, an inner surface, and an outer surface, wherein each said current terminal cavity is in communication with a corresponding one of said current terminal extension member openings.

3. A terminal block in accordance with claim 1 further comprising a plurality of potential terminal extension members located on said top of said terminal block, said plurality of potential terminal extension members comprising an opening therethrough, an inner surface, and an outer surface.

4. A terminal block in accordance with claim 1 further comprising a thermoplastic injection molding compound.

5. A terminal block in accordance with claim 4 wherein said thermoplastic injection molding compound comprises polyester.

6. A terminal block in accordance with claim 1 further comprising a thermoset material.

7. A terminal block in accordance with claim 6 wherein said thermoset material comprises phenolic.

8. A terminal block in accordance with claim 1 further comprising a plurality of potential lead connection openings, wherein each said potential lead connection opening is separated from adjacent potential lead connection openings by at least one barrier wall.

9. A terminal block in accordance with claim 1 wherein said terminal block is adapted to be used with self contained and transformer rated electricity meters.

10. A terminal block assembly comprising:
    a terminal block comprising a top, a plurality of test link spring cavities, and a plurality of current terminal cavities, said current terminal cavities including at least one rib, wherein said current terminal cavities are located on said top of said terminal block,
    a plurality of current terminals, each current terminal housed within a respective one of said current terminal cavities; and
    a plurality of test link connectors, each test link connector located, at least partially, within a respective one of said spring cavities.

11. A terminal block assembly in accordance with claim 10 wherein each said test link connector comprises a test link spring comprising:
    a first flat portion;
    a second portion extending from said first portion at an angle approximately about 90 degrees;
    a third portion extending from said second portion at an acute angle; and
    a fourth portion extending from said third portion at an obtuse angle when said test link spring is in an unstressed state, wherein said test link spring is configured to connect a potential wire to one of said current terminals.

12. A terminal block assembly in accordance with claim 11 wherein each said fourth portion of each said test link spring comprises an actuator screw insertion slot.

13. A terminal block assembly in accordance with claim 12 wherein each said test link connector further comprises an actuator screw having a shoulder for cooperating with said screw insertion slot, wherein at least one of said current terminals contains a threaded opening for mating with said actuator screw.

14. A terminal block assembly in accordance with claim 13 wherein said actuator screw is configured to screw into said current terminal threaded opening and thereby move said fourth portion of said test link spring from an open position in which said fourth portion of said test link spring is distanced from said current terminal to a closed position in which said fourth portion of said test link spring abuts said current terminal.

15. A terminal block assembly in accordance with claim 14 wherein said terminal block further comprises:
    a plurality of current terminal extension members located on said top of said terminal block;
    a plurality of potential terminal extension members located on said top of said terminal block;
    a plurality of test link spring insertion slots; each said test link spring adapted to be inserted, at least partially, into a respective one of said spring cavities through a respective one of said spring insertion slots; and a plurality of actuator screw openings, each said actuator screw opening in communication with a corresponding one of said test link spring cavities.

16. A test link spring for connecting an electricity meter to a current terminal, said test link spring comprising:

a first portion;

a second portion extending from said first portion at an angle approximately about 90 degrees;

a third portion extending from said second portion at an acute angle; and a fourth portion extending from said third portion at an obtuse angle when said test link spring is in an unstressed state.

17. A test link spring in accordance with claim 16, wherein said first portion comprises a flat portion comprising a first opening for a test fixture screw and a tab connected to said flat portion with a tab neck, said tab is adapted to be soldered to a potential terminal wire.

18. A test link spring in accordance with claim 17 wherein said first portion further comprises a second opening configured for insertion of at least a portion of the potential wire, said second opening is located on said tab.

19. A test link spring in accordance with claim 16 wherein said fourth portion comprises a slot for insertion of an actuator screw used to manipulate said fourth portion between an open position and a closed position wherein at said closed position said third portion extends from said second portion at an angle approximately equal to 90 degrees.

20. A test link spring in accordance with claim 16 wherein said first portion comprises a bend relief area that aids said test link spring in bending without permanent distortion.

21. A test link spring in accordance with claim 16 further comprising full hard brass, wherein said test link spring is approximately about 0.012 inch thick and is of sufficient length such that an end of said fourth portion deflects at least about 0.4 inch without permanent distortion.

22. A test link spring in accordance with claim 16 wherein said test link spring is configured to be used with an A-base meter terminal block.

23. An electricity meter comprising:

a terminal block comprising a top, a plurality of test link spring cavities, and a plurality of current terminal cavities including at least one rib, wherein said current terminal cavities are located on said top of said terminal block;

a plurality of current terminals, each current terminal housed within a respective one of said current terminal cavities; and a plurality of test link connectors, each test link connector located, at least partially, within a respective one of said spring cavities.

24. An electricity meter in accordance with claim 23 wherein each said test link connector comprises a test link spring comprising:

a first flat portion;

a second portion extending from said first portion at an angle approximately about 90 degrees;

a third portion extending from said second portion at an acute angle; and a fourth portion extending from said third portion at an obtuse angle when said test link spring is in an unstressed state, wherein said test link spring is configured to connect a potential wire to one of said current terminals.

25. An electricity meter in accordance with claim 24 wherein said terminal block further comprises:

a plurality of current terminal extension members located on said top of said terminal block;

a plurality of potential terminal extension members located on said top of said terminal block;

a plurality of test link spring insertion slots; each said test link spring adapted to be inserted, at least partially, into a respective one of said spring cavities through a respective one of said spring insertion slots; and a plurality of actuator screw openings, each said actuator screw opening in communication with a corresponding one of said test link spring cavities.

26. An electricity meter in accordance with claim 25 wherein each said fourth portion of each said test link spring comprises an actuator screw insertion slot.

27. An electricity meter in accordance with claim 26 wherein each said test link connector further comprises an actuator screw having a shoulder for cooperating with said screw insertion slot, wherein at least one of said current terminals contains a threaded opening for mating with said actuator screw.

28. An electricity meter in accordance with claim 27 wherein said actuator screw is configured to screw into said current terminal threaded opening and thereby move said fourth portion of said test link spring from an open position in which said fourth portion of said test link spring is distanced from said current terminal to a closed position in which said fourth portion of said test link spring abuts said current terminal.

29. A terminal block for an electricity meter, said terminal block comprising:

a top and a back;

a plurality of current terminal cavities including at least one rib, said current terminal cavities located in said back of said terminal block;

a plurality of slots;

a plurality of first openings located on said top of said terminal block, wherein each said first opening is in communication with a respective one of said slots; and a plurality of current terminal extension members located on said top of said terminal block, said plurality of current terminal extension members comprising a second opening therethrough, an inner surface, and an outer surface.

30. A terminal block in accordance with claim 29 wherein each said current terminal cavity is in communication with a corresponding one of said second openings.

31. A terminal block in accordance with claim 30 further comprising:

a plurality of potential terminal extension members located on said top of said terminal block, said potential terminal extension members comprising a third opening therethrough, an inner surface, and an outer surface; and a plurality of fourth openings, wherein each said fourth opening is separated from adjacent fourth openings by at least one barrier wall.

32. A terminal block in accordance with claim 29 further comprising a thermoplastic injection molding compound comprising polyester.

33. A terminal block in accordance with claim 29 wherein said terminal block is adapted to be used with self contained and transformer rated electricity meters.

* * * * *